(12) United States Patent
Lochner et al.

(10) Patent No.: US 12,368,173 B2
(45) Date of Patent: Jul. 22, 2025

(54) METHOD FOR DIAGNOSING AT LEAST ONE FUEL CELL STACK OF A FUEL CELL DEVICE, COMPUTER-READABLE STORAGE MEDIUM, AND FUEL CELL DIAGNOSTIC SYSTEM

(71) Applicant: Bayerische Motoren Werke Aktiengesellschaft, Munich (DE)

(72) Inventors: Tim Lochner, Forchheim (DE); Markus Perchthaler, Grafrath (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 582 days.

(21) Appl. No.: 17/786,725

(22) PCT Filed: Dec. 7, 2020

(86) PCT No.: PCT/EP2020/084886
§ 371 (c)(1),
(2) Date: Jun. 17, 2022

(87) PCT Pub. No.: WO2021/122104
PCT Pub. Date: Jun. 24, 2021

(65) Prior Publication Data
US 2023/0015110 A1    Jan. 19, 2023

(30) Foreign Application Priority Data
Dec. 19, 2019   (DE) .................. 10 2019 135 300.9

(51) Int. Cl.
*H01M 8/04*    (2016.01)
*G01R 31/36*   (2020.01)
(Continued)

(52) U.S. Cl.
CPC .... *H01M 8/04679* (2013.01); *G01R 31/3648* (2013.01); *G01R 31/389* (2019.01);
(Continued)

(58) Field of Classification Search
None
See application file for complete search history.

(56) References Cited

U.S. PATENT DOCUMENTS

2005/0048336 A1* 3/2005 Takebe .............. H01M 8/04228
429/432
2008/0318089 A1   12/2008 Schneider et al.
(Continued)

FOREIGN PATENT DOCUMENTS

CN          1577930 A    2/2005
CN        102576055 A    7/2012
(Continued)

OTHER PUBLICATIONS

International Search Report (PCT/ISA/210) issued in PCT Application No. PCT/EP2020/084886 dated Mar. 11, 2021 with English translation (four (4) pages).
(Continued)

*Primary Examiner* — Jas A Sanghera
(74) *Attorney, Agent, or Firm* — Crowell & Moring LLP

(57) ABSTRACT

A method for diagnosing at least one fuel cell stack of a fuel cell device by way of a fuel cell diagnostic system includes: impressing a sinusoidal first and at least one sinusoidal second AC current into the fuel cell stack; recording a sinusoidal first and second voltage response of the fuel cell stack; evaluating the first voltage response and evaluating the second voltage response by way of an analytical algorithm for a differential impedance analysis; determining a first resistance, a second resistance and a capacitance of the fuel cell stack by specifying an equivalent circuit diagram for the fuel cell stack; and diagnosing the fuel cell stack on the basis of the determined first resistance, the determined second resistance and the determined capacitance, wherein the diagnosis is carried out in real time. A computer-readable
(Continued)

storage medium and a fuel cell diagnostic system are also described.

13 Claims, 2 Drawing Sheets

(51) Int. Cl.
    *G01R 31/389*     (2019.01)
    *H01M 8/04492*     (2016.01)
    *H01M 8/04537*     (2016.01)
    *H01M 8/04664*     (2016.01)
    *H01M 8/04858*     (2016.01)

(52) U.S. Cl.
    CPC ... *H01M 8/04529* (2013.01); *H01M 8/04559* (2013.01); *H01M 8/04649* (2013.01); *H01M 8/0491* (2013.01); *H01M 2250/20* (2013.01)

(56) References Cited

U.S. PATENT DOCUMENTS

| | | |
|---|---|---|
| 2012/0215517 A1 | 8/2012 | Bohlen et al. |
| 2014/0159738 A1 | 6/2014 | Jeong et al. |
| 2014/0188414 A1 | 7/2014 | Jeong et al. |
| 2016/0006059 A1 | 1/2016 | Kwon et al. |
| 2016/0149240 A1* | 5/2016 | Won ............ G01R 31/40 324/764.01 |
| 2017/0324104 A1* | 11/2017 | Aoki ............ H01M 8/10 |

FOREIGN PATENT DOCUMENTS

| | | |
|---|---|---|
| CN | 103872362 A | 6/2014 |
| CN | 105280935 A | 1/2016 |
| CN | 107078323 A | 8/2017 |
| CN | 109726452 A | 5/2019 |
| DE | 10 2016 106 735 A1 | 10/2017 |
| EP | 1 501 146 A2 | 1/2005 |
| JP | 2005-63946 A | 3/2005 |

OTHER PUBLICATIONS

German-language Written Opinion (PCT/ISA/237) issued in PCT Application No. PCT/EP2020/084886 dated Mar. 11, 2021 (eight (8) pages).

German-language Search Report issued in German Application No. 10 2019 135 300.9 dated Sep. 17, 2020 with partial English translation (12 pages).

Chinese-language Office Action issued in Chinese Application No. 202080082264.X dated Apr. 27, 2023 with English translation (16 pages).

* cited by examiner

METHOD FOR DIAGNOSING AT LEAST ONE FUEL CELL STACK OF A FUEL CELL DEVICE, COMPUTER-READABLE STORAGE MEDIUM, AND FUEL CELL DIAGNOSTIC SYSTEM

BACKGROUND AND SUMMARY

The technology disclosed here relates to a method for diagnosing at least one fuel cell stack of a fuel cell device by way of a fuel cell diagnostic system. Furthermore, the technology disclosed here relates to a computer-readable storage medium and a fuel cell diagnostic system.

Methods for diagnosing a fuel cell device are already known in the prior art.

It is a preferred object of the technology disclosed here to reduce or remedy at least one disadvantage of a previously known solution or to propose an alternative solution. It is in particular a preferred object of the technology disclosed here to create a method, a computer-readable storage medium and a fuel cell diagnostic system, by means of which an improved diagnosis of a fuel cell stack can be carried out. Further preferred objects result from the advantageous effects of the technology disclosed here.

EP 1 501 146 A2 provides a fuel cell energy generating system which generates energy in that it supplies an oxygenated oxidizing agent to the cathode and a hydrogenated combustion gas to the anode. In addition, the fuel cell power generating system of the present embodiment has an AC signal generating block which varies the load current of the fuel cell, and a voltage measuring block, which measures the voltage response of the fuel cell. The impedance measuring block measures the impedance of the fuel cell from the phase difference between the voltage response and the load current. The operating conditions are varied as a function of the impedance value.

The objects may be achieved by the subjects of the independent claims. The dependent claims represent preferred embodiments.

One aspect of the disclosed technology relates to a method for diagnosing at least one fuel cell stack of a fuel cell device by way of a fuel cell diagnostic system. A sinusoidal first alternating current at a first frequency and at least one sinusoidal second alternating current at a second frequency different from the first frequency are applied to the fuel cell stack. A sinusoidal first voltage response of the fuel cell stack at the first frequency is detected and a sinusoidal second voltage response of the fuel cell stack at the second frequency is detected. A first AC voltage is evaluated as a function of the first voltage response and a second AC voltage is evaluated as a function of the second voltage response by way of an analytical algorithm for a differential impedance analysis of the fuel cell stack by way of an electronic computing unit of the fuel cell diagnostic system. A first resistance, a second resistance, and a capacitance of the fuel cell stack are determined as a function of the evaluation by specifying an equivalent circuit diagram for the fuel cell stack. The diagnosis of the fuel cell stack takes place as a function of the determined first resistance, the determined second resistance, and the determined capacitance.

The diagnosis is carried out in real time. In other words, in particular a present diagnosis of the fuel cell stack takes place. In particular, this can be carried out in real time. Real time is to be understood in particular as without delay. Real time is understood as the operation of a computing system in which programs for processing arising data are continuously ready for operation, in such a way that the processing results are available within a predefined time span. Depending on the application, the data can arise according to a chronologically random distribution or at predetermined points in time. It is thus made possible that corresponding readjustments can already be carried out early, so that the service life and the performance of the fuel cell stack or the fuel cell can be enhanced and the fuel consumption can be reduced.

In other words, the technology disclosed here relates to a fuel cell diagnostic system for diagnosing a fuel cell stack. A fuel cell stack can comprise a plurality of fuel cells. A fuel cell device can in turn comprise a plurality of fuel cell stacks. Reference is made hereinafter to a fuel cell stack, wherein a similar disclosure applies for a fuel cell. A fuel cell stack itself typically can be electrically described during vehicle operation by three equivalent circuit diagram components. In particular, for this purpose, a first resistance is described as the ohmic resistance of the fuel cell stack, a second resistance is described as the electrochemical resistance of the fuel cell stack, and a capacitance is described as the apparent capacitance. The apparent capacitance of the fuel cell stack is substantially dependent on the voltage of the fuel cell stack in the normal operation of the fuel cell system. If the ratio of voltage to capacitance is less than a defined limit, a malfunction of this fuel cell stack exists. This criterion can be detected and tracked synchronously for all fuel cells of a fuel cell stack. The electrochemical resistances, which correspond in particular to the second resistance, and also the capacitances behave differently depending on the fault of the fuel cell stack, for example, an undersupply of gases or an excessively high or low water content of the fuel cell stack. The identification of the fault can thus be carried out by way of a combination of the second resistance and the capacitance.

Alternatively, a first AC voltage at a first frequency and a second AC voltage at a second frequency different from the first frequency can also be applied and a respective current response can be detected at the first frequency and at the second frequency.

In particular, the first resistance can describe drying out of the fuel cell stack. For example, a large ohmic resistance can describe drying out of the fuel cell stack.

For this purpose, it can be provided, for example, that a DC-DC converter installed in the fuel cell diagnostic system applies a sinusoidal AC voltage to the fuel cell stack. The frequencies of the AC voltages may be varied. The sinusoidal voltage response of the fuel cell stack at the various excitation frequencies may be used to determine a double-layer capacitance as a capacitance of the fuel cell stack. Furthermore, the sinusoidal voltage response of the fuel cell stack at various excitation frequencies may be used to calculate the second resistance of the capacitance. The dependence of the capacitance as a function of the cell voltage is an unambiguous criterion that there is a fault in the vehicle operation. The dependence of the second resistance on the capacitance is a criterion for the cause of the fault. Faults in operation of the fuel cell stack may be diagnosed and identified by this evaluation.

The analytical method is in particular an analytical evaluation, wherein in particular a mathematical equation or an algorithm is specified for this purpose. It is thus not parameter fitting, as is carried out in the prior art. In particular, the analytical evaluation has the advantage that the diagnosis of the fuel cell stack can be carried out with little computing effort and in a short time. In the analytical algorithm, in particular the first resistance, the second resistance, and the capacitance are described by a mathematical equation so that the individual parameters can be determined as a function of the applied AC voltage and the voltage response. In particular, the diagnosis of the fuel cell stack can thus be carried out in real time and, for example, during driving operation of the motor vehicle.

The fuel cell stack can be used, for example, in a motor vehicle as an energy production device. This is to be understood solely as an example and is in no way to be viewed as exhaustive. The method according to the invention can also be used in other devices which have a fuel cell device.

The presented technology is carried out for a diagnosis during driving operation of the motor vehicle. In other words, in particular, a present diagnosis of the fuel cell stack takes place. Furthermore, this can be carried out in particular during the driving operation of the motor vehicle. It is thus made possible that corresponding readjustments can already be carried out early, so that the service life and the performance of the fuel cell stack or the fuel cell can be enhanced and the fuel consumption can be reduced.

According to the technology disclosed here, a double-layer capacitance of the fuel cell stack can be determined as the capacitance. A double-layer capacitance arises in particular after the application of an electrical voltage by charge separation in a Helmholtz double layer at the phase boundary between the electrode surface and electrolyte. The electrical energy in the double-layer capacitance is statically stored in an electrical field. By way of the measurement of the double-layer capacitance, in particular, an operating state determination of the fuel cell stack can be carried out in real time. In particular, an undersupply of hydrogen or of oxygen can be determined as a function of the double-layer capacitance. In particular, it can be provided that, for example, in the event of a determined undersupply of hydrogen or in the event of a determined undersupply of oxygen, a possible regulation or readjustment of hydrogen or oxygen can be implemented. In particular, this has the advantage that during the operation of the fuel cell device, a corresponding readjustment can be carried out, so that improved operation of the fuel cell device can be implemented. In particular, this can contribute to lengthening the service life of the fuel cell device, improving the system performance, and reducing the fuel consumption.

Furthermore, according to the presented technology, a fault can be determined as a diagnosis by way of the electronic computing unit by evaluating the determined double-layer capacitance as a function of a present cell voltage of the fuel cell stack. In other words, it can be determined as a function of the double-layer capacitance whether a fault exists at all. The double-layer capacitance as a function of the present cell voltage thus forms an unambiguous criterion that a fault exists in the vehicle operation. For example, an item of information can then be generated for a user of a motor vehicle in which the fuel cell device is installed and a corresponding readjustment can be carried out.

Furthermore, the present technology can be used, by determining the first resistance, to recognize and exclude an influence due to drying out of the polymer layers of the fuel cell on the double-layer capacitance and the second resistance.

Furthermore, according to the present technology, a cause of fault can be determined as a diagnosis by way of the electronic computing unit by evaluating the determined capacitance as a function of the determined second resistance. It is thus made possible that, in addition to the fault, the cause of fault can also be determined, so that a readjustment can be carried out reliably, for example.

Furthermore, according to the present technology, in the equivalent circuit diagram, the second resistance can be specified as connected in parallel to the capacitance and the first resistance can be specified as connected in series thereto and/or the first resistance can be specified as the ohmic resistance of the fuel cell stack, the second resistance as the electrochemical resistance of the fuel cell stack, and the capacitance as the apparent capacitance of the fuel cell stack. It is thus made possible that the fuel cell stack can be electrically described by way of a simple equivalent circuit diagram. In particular, an evaluation of the present condition of the fuel cell stack can then be carried out on the basis of this by way of the simple analytical algorithm.

Furthermore, it can be provided in the presented technology that the AC voltages are applied at a frequency essentially between 100 mHz and 1 kHz, preferably between 100 Hz and 300 Hz. In particular, frequencies can thus be applied as the AC voltage between 10 Hz and 1 kHz. It is thus made possible that the voltage responses can be ascertained in short times and therefore the entire method can be carried out in a short time. In particular the real time diagnosis can thus be implemented in driving operation of the motor vehicle.

The presented technology can furthermore diagnose an undersupply of hydrogen in the fuel cell stack upon a determination of a drop of the capacitance and a uniform second resistance or diagnose an undersupply of oxygen in the fuel cell stack upon a determination of a constant capacitance and a rising second resistance. In particular, the diagnosis can thus determine a cause of fault. For example, in the event of an undersupply of hydrogen, a corresponding readjustment of hydrogen can be carried out. Furthermore, in the event of an established undersupply of oxygen, a corresponding readjustment of oxygen can be carried out. Therefore, the cause of fault can be diagnosed reliably as a function of the determined capacitance and the determined second resistance and a corresponding readjustment can be carried out. In particular the total capacitance of the anode and the cathode can be viewed as the capacitance. In particular, the total capacitance is determined as the reciprocal from the individual reciprocal sums of the anode and the cathode. The anode has a very high capacitance value in relation to the cathode, so that this has little influence due to the reciprocal, because of which the capacitance value of the cathode is viewed as the reference value. If it should be determined that the total capacitance value is less than the capacitance value of the cathode, an oxygen undersupply can thus be concluded.

In the disclosed technology, a present moisture value of a polymer membrane of a fuel cell of the fuel cell stack can be taken into consideration in the determination of the drop of the capacitance. In particular, the moisture value of this polymer membrane can change, but this moisture value has an influence on the capacitance. A diagnosis of the fuel cell stack with respect to the hydrogen undersupply can thus be reliably implemented by consideration of the moisture value.

The presented technology also relates to a computer-readable storage medium, on which program instructions are stored which, upon execution by a microprocessor, cause it to carry out a method according to the preceding aspect.

The technology also relates to a fuel cell diagnostic system having an electronic computing unit and having a computer-readable storage medium, wherein the fuel cell diagnostic system is designed to carry out a method according to the preceding aspect. In particular, the method is carried out by way of the fuel cell diagnostic system.

BRIEF DESCRIPTION OF THE DRAWINGS

The technology disclosed here will be explained on the basis of the figures. In the figures.

DETAILED DESCRIPTION OF THE DRAWINGS

Figure 1:
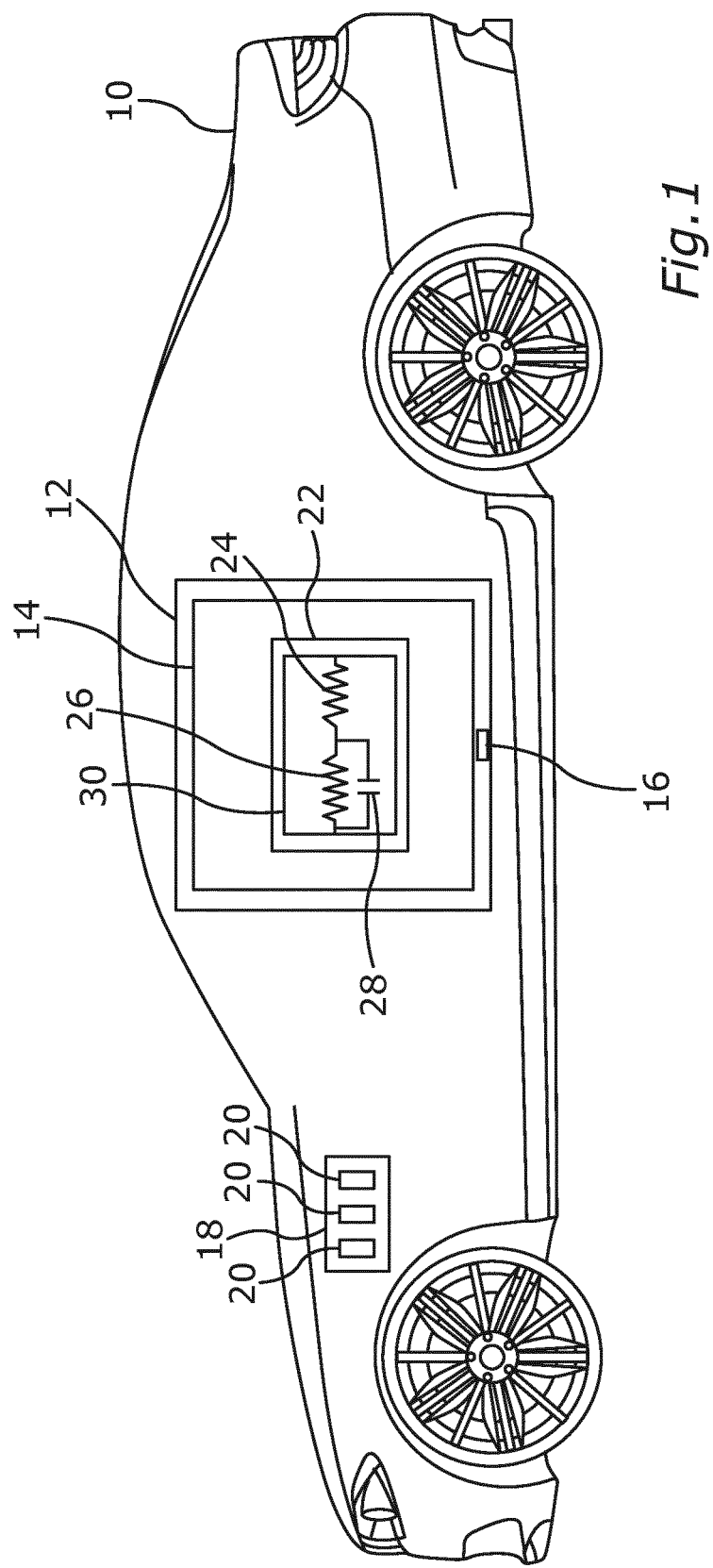
FIG. 1 shows a schematic illustration of a motor vehicle having a fuel cell diagnostic system.

FIG. 1 shows a schematic side view of a motor vehicle 10 having a fuel cell diagnostic system 12. The fuel cell diagnostic system 12 has at least one electronic computing unit 14 and a computer-readable storage medium 16. The motor vehicle 10 furthermore has a fuel cell device 18. The fuel cell device 18 in particular has a plurality of fuel cell stacks 20, in the present case, three fuel cell stacks 20. A respective fuel cell stack 20 can in turn have a plurality of fuel cells.

The technology presented in this disclosure relates to a method for diagnosing at least one of the fuel cell stacks 20 of the fuel cell device 18 by way of the fuel cell diagnostic system 12. A sinusoidal first AC voltage is applied at a first frequency and at least one sinusoidal second AC voltage is applied at a second frequency different from the first frequency to the fuel cell stack 20. A sinusoidal first voltage response of the fuel cell stack 20 at the first frequency and a sinusoidal second voltage response of the fuel cell stack 20 at the second frequency are detected. The first AC voltage is evaluated as a function of the first voltage response and the second AC voltage is evaluated as a function of the second voltage response by way of an analytical algorithm 22 for a differential impedance analysis of the fuel cell stack 20 by way of the electronic computing unit 14 of the fuel cell diagnostic system 12. A first resistance 24, a second resistance 26, and a capacitance 28 of the fuel cell stack 20 are determined as a function of the evaluation by specifying an equivalent circuit diagram 30 for the fuel cell stack 20. The fuel cell stack 20 is diagnosed as a function of the determined first resistance 24, the determined second resistance 26, and the determined capacitance 28.

In particular, occurring faults can result in impairment of the system performance, service life, and the fuel consumption/system efficiency. These faults can be partially intercepted via the operating strategy for the fuel cell device 18, but, for this purpose, it may be necessary to transfer data in real time which contain items of information about malfunctions of individual fuel cells. This is possible by way of the presented method.

Figure 2:
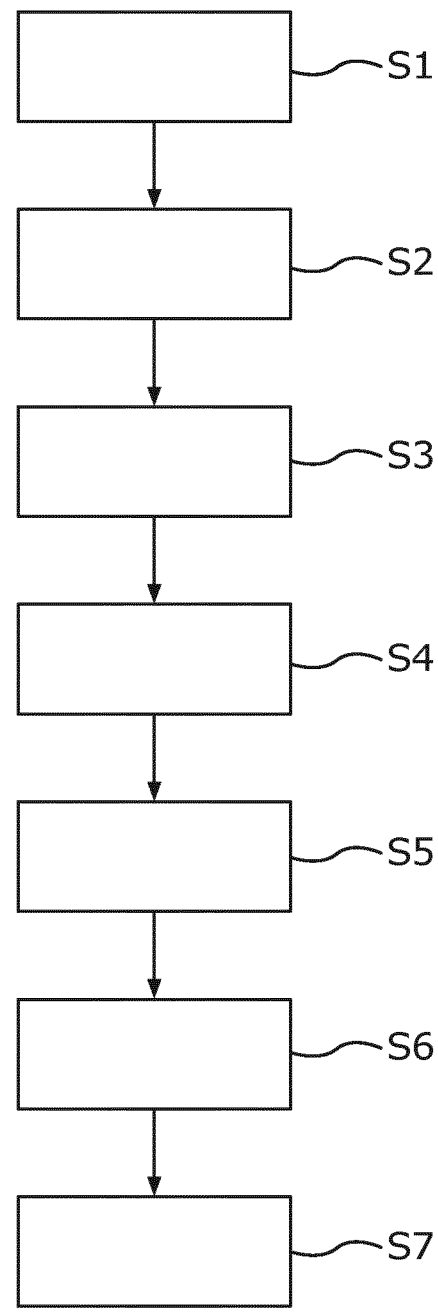
FIG. 2 shows a schematic illustration of a flow chart of an embodiment of the method.

In particular, FIG. 2 shows that, in the equivalent circuit diagram 30, the second resistance 26 is specified as connected in parallel to the capacitance 28 and the first resistance 24 is specified as connected in series thereto. Furthermore, FIG. 1 shows that the first resistance 24 is in particular specified as the ohmic resistance of the fuel cell stack 20, the second resistance 26 as the electrochemical resistance of the fuel cell stack 20, and the capacitance 28 as the apparent capacitance of the fuel cell stack 20. The capacitance 28 is in particular a double-layer capacitance of the fuel cell stack.

In particular, the method presented for the fuel cell stack 20 can also be applied in the case of a single fuel cell.

In the following description of the alternative exemplary embodiment illustrated in FIG. 2, identical reference signs are used for features which are identical and/or at least comparable in comparison to the first exemplary embodiment shown in FIG. 1 in their design and/or mode of action. If these are not explained in detail once again, their design and/or mode of action corresponds to the design and/or mode of action of the above-described features.

FIG. 2 shows a schematic view of a flow chart for carrying out the method. In particular, FIG. 2 shows that in a first step S1, a DC-DC converter installed in the fuel cell diagnostic system 12, which can also be referred to, for example, as a DC/DC converter, applies the sinusoidal AC voltage to the fuel cell stack 20. In a second step S2, the frequencies of the sinusoidal AC voltage are varied. In particular, for example, the applied AC voltages can be applied essentially between 100 mHz and 1 kHz, preferably between 100 Hz and 300 Hz. In other words, the first frequency can be applied between 100 mHz and 1 kHz and the second frequency can be applied between 100 mHz and 1 kHz. In particular, for example, it can be provided that at least five different frequencies are applied as the AC voltage to the fuel cell stack 20. In a third step S3, the detected sinusoidal voltage response of the fuel cell stack 20 at the various excitation frequencies is used to determine the capacitance 28, in particular the double-layer capacitance of the fuel cell stack 20.

In a fourth step S4, the sinusoidal voltage response of the fuel cell stack 20 at the various excitation frequencies is used to determine the second resistance 26.

In a fifth step S5, the dependency of the capacitance 28 is determined as a function of a respective cell voltage of the fuel cell stack 20, wherein this dependence is an unambiguous criterion that a fault exists in the fuel cell stack 20. In other words, it is provided that, by evaluating the determined capacitance 28, in particular the determined double-layer capacitance, as a function of the present cell voltage of the fuel cell stack 20, a fault is determined as a diagnosis by way of the electronic computing unit 14.

Furthermore, in a sixth step S6, the dependency of the second resistance 26 to the capacitance 28 is determined, wherein a cause of fault can thus be determined. In other words, it can be provided that by evaluating the determined capacitance 28 and as a function of the determined second resistance 26, a cause of fault is determined as the diagnosis by way of the electronic computing unit 14.

In a seventh step S7, the faults in the fuel cell stack 20 are diagnosed and identified by the evaluation of the second resistance 26 and the capacitance 28. In particular, it can be provided for this purpose that the diagnosis is carried out in real time. Furthermore, it can be provided that the diagnosis is carried out during driving operation of the motor vehicle 10.

For example, it can be provided that an undersupply of hydrogen in the fuel cell stack 20 is diagnosed upon a determination of a drop of the capacitance 28 and a uniform second resistance 26 or an undersupply of oxygen in the fuel cell stack 20 is diagnosed upon a determination of a constant capacitance 28 and a rising second resistance 26.

For example, it can then be provided that, upon a diagnosed undersupply of hydrogen, hydrogen can accordingly be resupplied by way of a regulation. Alternatively, upon an undersupply of oxygen, a regulation can be carried out so that oxygen can be resupplied. It is thus made possible, for example, that the service life of the fuel cell device 18 can be lengthened. Furthermore, the performance of the fuel cell device 18 can be improved and the fuel consumption can be reduced.

In particular, the invention may use the fact that, in contrast to the prior art, an analytical evaluation of the parameters of the equivalent circuit diagram 30 is carried out. In particular, computing effort can be saved and the analysis can be carried out in reduced time by the analytical evaluation. In particular, the diagnosis of the fuel cell stack 20 can thus be carried out in real time by a predefined equation, which in particular corresponds to the algorithm. Therefore, parameter fitting does not take place, as is the case in the prior art. In particular, the invention furthermore may use the finding here that the capacitance 28 represents a double-layer capacitance, due to which the diagnosis can be carried out reliably. An operating condition determination of the fuel cell device 18 can thus be carried out in real time.

Furthermore, the invention may use the fact in particular that the electrical capacitance 28 of the fuel cell stack 20 is decisively dependent in normal operation of the fuel cell system on the voltage of the fuel cell stack 20. If the ratio of voltage to capacitance 28 is less than a certain limit, there is a malfunction of the fuel cell stack 20. This criterion can be detected and tracked synchronously for all cells of the fuel cell stack. The electrochemical resistances, as the second resistance 26 corresponds to in particular, and also the capacitance 28 behave differently depending on the fault of the fuel cell stack 20, for example, upon an undersupply of gases, excessively high/low water content of the fuel cells. The identification of the fault can thus be carried out by way of the combination of the second resistance 26 and the capacitance 28.

The term "essentially" in the context of the technology disclosed here comprises in each case the precise property or the precise value and also respective deviations unimportant for the function of the property/the value.

The preceding description of the present invention only serves for illustrative purposes and not for the purpose of restricting the invention. Various changes and modifications are possible in the context of the invention without leaving the scope of the invention and its equivalents.

The invention claimed is:

1. A method for diagnosing at least one fuel cell stack of a fuel cell device via a fuel cell diagnostic system, the method comprising:
    applying a sinusoidal first alternating current at a first frequency and applying at least one sinusoidal second alternating current at a second frequency different from the first frequency to the fuel cell stack;
    detecting a sinusoidal first voltage response of the fuel cell stack at the first frequency and detecting a sinusoidal second voltage response of the fuel cell stack at the second frequency;
    evaluating a first AC voltage as a function of the first voltage response and evaluating a second AC voltage as a function of the second voltage response via an analytical algorithm for a differential impedance analysis of the fuel cell stack by way of an electronic computing unit of the fuel cell diagnostic system, wherein the detected sinusoidal voltage response of the fuel cell stack at various excitation frequencies is used to determine a capacitance;
    determining a first resistance, a second resistance, and the capacitance of the fuel cell stack as a function of the evaluation by specifying an equivalent circuit diagram for the fuel cell stack, wherein the sinusoidal voltage response of the fuel cell stack at the various excitation frequencies is used to determine the second resistance; and
    diagnosing the fuel cell stack as a function of the determined first resistance, the determined second resistance, and the determined capacitance, wherein the diagnosis is carried out in real time, wherein the diagnosis is carried out during driving operation of a motor vehicle,
    wherein a fault is determined as a diagnosis by means of the electronic computing unit by evaluating the determined capacitance as a function of a present cell voltage of the fuel cell stack.

2. The method according to claim 1, wherein a double-layer capacitance of the fuel cell stack is determined as the capacitance.

3. The method according to claim 1, wherein a cause of fault is determined as a diagnosis by means of the electronic computing unit by evaluating the determined capacitance as a function of the determined second resistance.

4. The method according to claim 1, wherein, in the equivalent circuit diagram, the second resistance is specified as connected in parallel to the capacitance and the first resistance is specified as connected in series thereto.

5. The method according to claim 1, wherein, in the equivalent circuit diagram, the first resistance is specified as the ohmic resistance of the fuel cell stack, the second resistance as the electrochemical resistance of the fuel cell stack, and the capacitance as the apparent capacitance of the fuel cell stack.

6. The method according to claim 1, wherein the AC voltages are applied at a frequency between 100 mHz and 1 kHz.

7. The method according to claim 6, wherein the frequency is between 100 Hz and 300 Hz.

8. The method according to claim 1, wherein an undersupply of hydrogen in the fuel cell stack is diagnosed upon a determination of a drop of the capacitance and a uniform second resistance.

9. The method according to claim 8, wherein a present moisture value of a polymer membrane of a fuel cell of the fuel cell stack is taken into consideration in the determination of the drop of the capacitance.

10. The method according to claim 1, wherein an undersupply of oxygen in the fuel cell stack is diagnosed upon a determination of a constant capacitance and a rising second resistance.

11. A non-transitory computer-readable storage medium, on which program instructions are stored, which, upon execution by a microprocessor, cause it to carry out the method according to claim 1.

12. A fuel cell diagnostic system having an electronic computing unit and having a computer-readable storage medium, wherein the fuel cell diagnostic system is designed to carry out the method according to claim 1.

13. A method for diagnosing at least one fuel cell stack of a fuel cell device via a fuel cell diagnostic system, the method comprising:
    applying a sinusoidal first alternating current at a first frequency and applying at least one sinusoidal second alternating current at a second frequency different from the first frequency to the fuel cell stack;
    detecting a sinusoidal first voltage response of the fuel cell stack at the first frequency and detecting a sinusoidal second voltage response of the fuel cell stack at the second frequency;
    evaluating a first AC voltage as a function of the first voltage response and evaluating a second AC voltage as a function of the second voltage response via an analytical algorithm for a differential impedance analysis of the fuel cell stack by way of an electronic computing unit of the fuel cell diagnostic system, wherein the detected sinusoidal voltage response of the fuel cell stack at various excitation frequencies is used to determine a capacitance;

determining a first resistance, a second resistance, and the capacitance of the fuel cell stack as a function of the evaluation by specifying an equivalent circuit diagram for the fuel cell stack, wherein the sinusoidal voltage response of the fuel cell stack at the various excitation frequencies is used to determine the second resistance; and diagnosing the fuel cell stack as a function of the determined first resistance, the determined second resistance, and the determined capacitance, wherein the diagnosis is carried out in real time, wherein the diagnosis is carried out during driving operation of a motor vehicle, wherein an undersupply of hydrogen in the fuel cell stack is diagnosed upon a determination of a drop of the capacitance and a uniform second resistance, or wherein an undersupply of oxygen in the fuel cell stack is diagnosed upon a determination of a constant capacitance and a rising second resistance.

* * * * *